(12) United States Patent
Mimura et al.

(10) Patent No.: US 7,523,829 B2
(45) Date of Patent: Apr. 28, 2009

(54) PRECISION SUBSTRATE STORAGE CONTAINER

(75) Inventors: Hiroshi Mimura, Kawagoe (JP); Wataru Niiya, Edogawa-ku (JP); Toshiyuki Kamada, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 438 days.

(21) Appl. No.: 10/548,212

(22) PCT Filed: Feb. 10, 2004

(86) PCT No.: PCT/JP2004/001369

§ 371 (c)(1), (2), (4) Date: May 22, 2006

(87) PCT Pub. No.: WO2004/079818

PCT Pub. Date: Sep. 16, 2004

(65) Prior Publication Data

US 2006/0207916 A1 Sep. 21, 2006

(30) Foreign Application Priority Data

Mar. 4, 2003 (JP) ............................. 2003-057473

(51) Int. Cl.
*B65D 85/00* (2006.01)
(52) U.S. Cl. ...................... 206/710; 206/232
(58) Field of Classification Search ......... 206/710–712, 206/832, 459.1, 459.5, 454, 232; 340/572.1, 340/572.8, 10.42, 10.1; 248/124.2, 213.2, 248/207, 346.06; 40/312, 313, 661.06, 661.07
See application file for complete search history.

(56) References Cited

U.S. PATENT DOCUMENTS

| 4,827,110 A | 5/1989 | Rossi et al. |
| 4,888,473 A | 12/1989 | Rossi et al. |
| 4,974,166 A | 11/1990 | Maney et al. |
| 5,097,421 A | 3/1992 | Maney et al. |
| 5,166,884 A | 11/1992 | Maney et al. |
| 5,755,332 A | 5/1998 | Holliday et al. |
| 6,098,809 A | 8/2000 | Okada et al. |
| 6,164,530 A | 12/2000 | Cheesebrow et al. |

(Continued)

FOREIGN PATENT DOCUMENTS

JP 05-235155 A 9/1993

(Continued)

*Primary Examiner*—Mickey Yu
*Assistant Examiner*—Melissa L Lalli
(74) *Attorney, Agent, or Firm*—Buchanan Ingersoll & Rooney PC

(57) ABSTRACT

The precision substrate storage container includes a bottom plate 20 removably attached to the bottom of a container body 1 in which a multiple number of semiconductor wafers are accommodated in alignment; a holder 50 removably supported on bottom plate 20; and a RFID system transponder 60 held in holder 50. Bottom plate 20 includes a base plate 21 opposing the rear bottom of container body 1 and a wall plate 30 erected on base plate 21. The base plate 21 is formed with a first supporting structure 40 for supporting holder 50 that is oriented in the horizontal direction and a second supporting structure 43 for supporting holder 50 that is oriented in the vertical direction so as to selectively change the position of holder 50 taking one of the two directions, longitudinal and transverse.

13 Claims, 9 Drawing Sheets

U.S. PATENT DOCUMENTS 6,320,509 B1 * 11/2001 Brady et al. ............. 340/572.7
7,070,053 B1 * 7/2006 Abrams et al. ........... 206/459.5

FOREIGN PATENT DOCUMENTS

| | | |
|---|---|---|
| JP | 07-283299 A | 10/1995 |
| JP | 2651357 | 9/1997 |
| JP | 2000-021966 A | 1/2000 |
| JP | 2000-21966 A | 1/2000 |
| JP | 2000-315721 A | 11/2000 |

* cited by examiner

PRECISION SUBSTRATE STORAGE CONTAINER

TECHNICAL FIELD

The present invention relates to a precision substrate storage container which is used for storage, preservation, transportation, conveyance and shipment of precision substrates such as semiconductor wafers, mask glass and the like, and which can be coupled to mechanical interface (SMIF), FIMS (Front-opening interface Mechanical Standard) system and the like, standardized for the precision substrate fabrication process.

BACKGROUND ART

Though unillustrated, a conventional precision substrate storage container is composed of a container body for storing multiple semiconductor wafers in alignment, a door component for opening and closing the container body and a bottom plate attached to the bottom surface of the container body.

The container body has a front-open box configuration having an opening in the front and a multiple number of paired supporting ribs arranged vertically on the interior walls on both sides for supporting semiconductor wafers horizontally. Formed on the interior periphery on the front side are a multiple number of engaging holes. The door component incorporates a latching mechanism which, by control from the outside, fits retractable engaging claws into the engaging holes.

In the above configuration, when multiple semiconductor wafers are processed, the precision substrate storage container, together with an empty in-process container or an open cassette, is set and positioned onto the carrier stage of handling equipment, first.

Thereupon, the latching mechanism of the door component is unlocked, the door component for securing airtightness is removed from the front of the container body to open the container body. As the container body is opened in this way, multiple semiconductor wafers are checked as to their storage state and taken out one by one from the lowermost by means of a transfer device of the handling equipment and brought, one by one, into an empty in-process container or open cassette from the bottom. Thereafter the wafers will be subjected to predetermined processes.

Upon processing and fabrication of semiconductor wafers, it is necessary to exactly discriminate and identify the type of the semiconductor wafers and the information as to the precision substrate storage container etc. In order to make such identification, conventionally, a production system using a non-contact type communication device has been established, and a technique for providing a pocket for a transponder of a non-contact type communication type in the precision substrate storage container has been proposed (Japanese Patent Application Laid-open 2000-21966). There is also another disclosure of a technique whereby a holder groove is formed at one end part of a transport carrier of semiconductor wafers and a transponder or the like is accommodated in the holder groove and the opening is enclosed (Japanese Patent No. 2651357).

In the prior art, the type of semiconductor wafers and the information as to the precision substrate storage container etc., are discriminated and identified in the above ways, however, these techniques entail the following problems.

First, in ether case of the above patent literatures, since the transponder is oriented to one direction only, communication failure is liable to take place even if an identical transponder is used, depending on the setup specification of the communication area on the equipment side; this is a big problem. Generally, a typical transponder is given in a cylindrical form, which is prone to induce setting in a wrong direction. Wrong directivity degrades information transfer performance and may cause difference in information transmission function during use even if transponders and precision substrate storage containers of the same kinds are used.

Detail of this problem will be described taking an example of a production system using a typical RFID. Generally, a RFID system includes a host computer, an interrogator (reader/writer) and a transponder (IC tag). The interrogator is composed of a controller, a transmitter/receiver and an antenna, and exchanges information with the host computer under its control. This interrogator has the functions of reading and checking the information from the transponder and writing information into it, and is mounted in the equipment handling the precision substrate storage containers and predetermined equipment in the process. The transponder is composed of an antenna, a transmitter/receiver and a memory, and is mounted in the precision substrate storage container and records the semiconductor wafers' lot, in-process fabrication or work progress in the process.

The production system of this kind may use various transmission systems such as an electromagnetic coupling system, electrostatic coupling system, microwave system, optical communication system or the like, and specifications including the communication distance, storage capacity, environment resistance and others should be designated depending on the selected system.

Meanwhile, system configurations have not been unified in different plants handling precision substrate storage containers while the position and direction for transmitting and receiving transmission signals are diverse between different equipment units. As a result, if a precision substrate storage container with RFID, which has functioned correctly at a certain plant, is attempted to be used in another plant or another process, there is more than a little possibility of information exchange becoming difficult or impossible.

Further, since the usable frequency for the reading/writing area is different depending on the country, if a precision substrate storage container is used abroad, the precision substrate storage container should be configured so as to be usable inside and outside the country, or it is necessary to severely manage and discriminate the products for domestic use and overseas use.

Furthermore, though the transponder of the system is communicable even if it is more or less deviated from the front of the interrogator, the reading area becomes smaller by 20 to 30% as its relative position to the interrogator changes 90 degrees, therefore there is a fear of communication errors occurring due to its position relative to the interrogator. Accordingly, there is demand for a universal precision substrate storage container with a built-in transponder, which can support any system and has interchangeability between plants and between equipment units. However, if the reading area is enlarged so as to solve the above problem, there occurs a new problem in that the contents from other adjacent transponders residing nearby may be erroneously picked up.

DISCLOSURE OF INVENTION

The present invention has been devised in view of the above, it is therefore an object to provide a precision substrate storage container which is able to prevent communication failure and lowering of information transmission function by permitting its non-contact type information medium to change its directivity in multiple directions, and which brings no variation into information transmission ability even if it is used at different sites, with different equipment units or in other ways.

In order to achieve the above object, the invention includes: a container body for accommodating precision substrates; and a non-contact type information medium supported by the container body for identifying the container body and/or precision substrates, and is characterized in that the position of the non-contact type information medium is changed so as to take one of at least two different directions.

The precision substrates may be semiconductor wafers, the container body may have a front-open box configuration, of which the front is opened and closed by a door component.

The non-contact type information medium may be a transponder that responds to an interrogator of a RFID system.

The transponder may at least include an antenna, a transmitter/receiver and a memory and may be shaped in an approximately cylindrical form.

A holder in which the transponder is fitted is further provided and the holder may be given in a form having an approximately U-shaped section, and a multiple number of flanges may be projected outwards from the periphery of the holder's opening.

The holder may be formed with passage holes at least providing a water draining function.

Further, in order to achieve the above object, the invention includes: a container body having an opening on one side to which precision substrates are loaded; and a door component for closing the opening of the container body, and is characterized in that a plate is attached so as to at least oppose one side of the container body and the plate is adapted to support a non-contact type information medium for identifying the container body and/or precision substrates in a changeable manner that allows the medium to orient in at least two different directions.

The non-contact type information medium may be a transponder that responds to an interrogator of a RFID system.

The transponder may, at least, include an antenna, a transmitter/receiver and a memory and may be shaped in an approximately cylindrical form.

The plate may comprise: a base plate that at least opposes the bottom of the container body; a wall plate erected on the base plate; a first supporting structure provided for the base plate for supporting the non-contact type information medium in an approximately horizontal direction; and a second supporting structure provided for the wall plate for supporting the non-contact type information medium in an approximately vertical direction.

Also, the container body may have a front open box configuration of which the front is opened and closed by a door component, a plate may be attached to the container body, and a non-contact type information medium may be supported on the plate by means of the holder.

Also, the container body may have a front open box configuration of which the front is opened and closed by a door component, a plate may be attached to the container body, and a non-contact type information medium may be supported on the plate by means of the holder.

Also, the plate may comprise: a base plate that at least opposes the bottom of the container body; a wall plate erected on the base plate; a first supporting structure provided for the base plate for supporting the holder in an approximately horizontal direction; and a second supporting structure provided for the wall plate for supporting the holder in an approximately vertical direction.

It is also possible that a pair of supporting ribs are provided on both sides on the rear bottom of the container body, and supported elements that are to be removably attached to the supporting ribs are provided at both sides of the base plate.

It is also preferred that a multiple number of cap holes are formed in the base plate, and the multiple cap holes are selectively fitted with caps so as to allow for identification of the specifications of the precision substrates.

It is also preferred that the wall plate is arranged so that the inner surface thereof opposes the backside of the container body and a bar code is attached to the outer surface of the wall plate.

Further, the first supporting structure may be composed of multiple engaging claws that are hooked on the both ends of the holder and an engaging rib that is hooked on the side part of the holder by means of a flange.

Still more, the second supporting structure may be composed of an engaging rib that is hooked on the top end of the holder and multiple engaging claws that are hooked on the both sides of the holder by means of flanges.

Also, in order to achieve the above object, the present invention comprises: a container body for accommodating precision substrates; a non-contact type information medium supported by the container body for identifying the container body and/or precision substrates; and a plate attached so as to at least oppose one side of the container body, the plate comprising: a base plate that at least opposes the bottom of the container body; a wall plate erected on the base plate; a first supporting structure provided for the base plate for supporting the non-contact type information medium in an approximately horizontal direction; and a second supporting structure provided for the wall plate for supporting the non-contact type information medium in an approximately vertical direction, and is characterized in that at least one of the first and second supporting structures is composed of multiple engaging claws that define a polygon greater than the non-contact type information medium and hold the corners of the non-contact type information medium and a pair of engaging ribs located at the middle points of the long sides of the polygon defined by the multiple engaging claws so that, when the non-contact type information medium is arranged obliquely, the non-contact type information medium is held between the engaging claws and the engaging ribs come into contact with the sides of the non-contact type information medium, and that the position of the non-contact type information medium can be changed so as to take one of three directions, making use of the engaging claws and engaging ribs.

Further, in order to achieve the above object, the present invention comprises: a non-contact type information medium for identifying precision substrates and/or the container body that holds the precision substrates; and a holder in which the non-contact type information medium is fitted.

Here, the precision substrates in the scope of the claims at least include: 150 mm (6 inch), 200 mm (8 inch) and 300 mm (12 inch) semiconductor wafers (silicon wafers), mask glass, liquid crystal cells, quartz glass, mask substrates and the like. The number of precision substrates may be single or plural. The container body may include a front open box which at least has an opening in front, an open box which has two openings in front and at the rear and carriers and the like. The container body may be subjected to an electrostatic process and the like as required.

The non-contact type information medium includes communication devices, at least, comprised of a non-contact type transponder for information transmission. The two different directions should at least include a horizontal direction approximately parallel to, and a direction approximately vertical to, a reference plane in the height direction when the precision substrate storage container is positioned and mounted on processing equipment. The directions may further include three, four or more directions including transverse, longitudinal and oblique directions. The approximately U-shaped section of the holder should at least include C-shaped, U-shaped, V-shaped and analogous sections. The number of the passage holes may be a single or plural or may be increased or decreased. The passage hole may include a penetrated groove and a cutout.

The base plate of the plate may be one that opposes the entire bottom of the container body, or one that opposes part of the bottom, and may be integrally formed with the wall plate. The wall plate may be formed of a flat plate, given in a form having an approximately semi-circular or L-shaped section. It may be fixed to, or removably attached to, the base plate. Also, it may be attached so as to be slidable transversally or may be supported in an foldable manner. Further, it may be provided upright, or inclined, relative to the base plate.

The precision substrate storage container according to the present invention can be used as, at least, a carrier for use in manufacturing of semiconductors, an in-process transport carrier (FOUP), or an FOSB for shipment.

BEST MODE FOR CARRYING OUT THE INVENTION

Referring next to the drawings, the preferred embodiment of the present invention will be described. As shown in FIGS. 1 to 10, a precision substrate storage container of the present embodiment includes: a container body 1 for accommodating multiple semiconductor wafers; a bottom plate 20 as a plate that is detachably mounted at the rear part of the bottom of the container body 1; a holder 50 removably supported on the bottom plate 20; and a RFID system transponder 60 fitted and held in the holder 50, wherein holder 50 is configured so that its position can be selectively changed between the horizontal position and the vertical position.

Though not illustrated, the semiconductor wafers are disc-like silicon wafers of 300 mm (12 inch) in diameter, for example, and usually, 25 or 26 wafers are accommodated in alignment.

Figure 1:
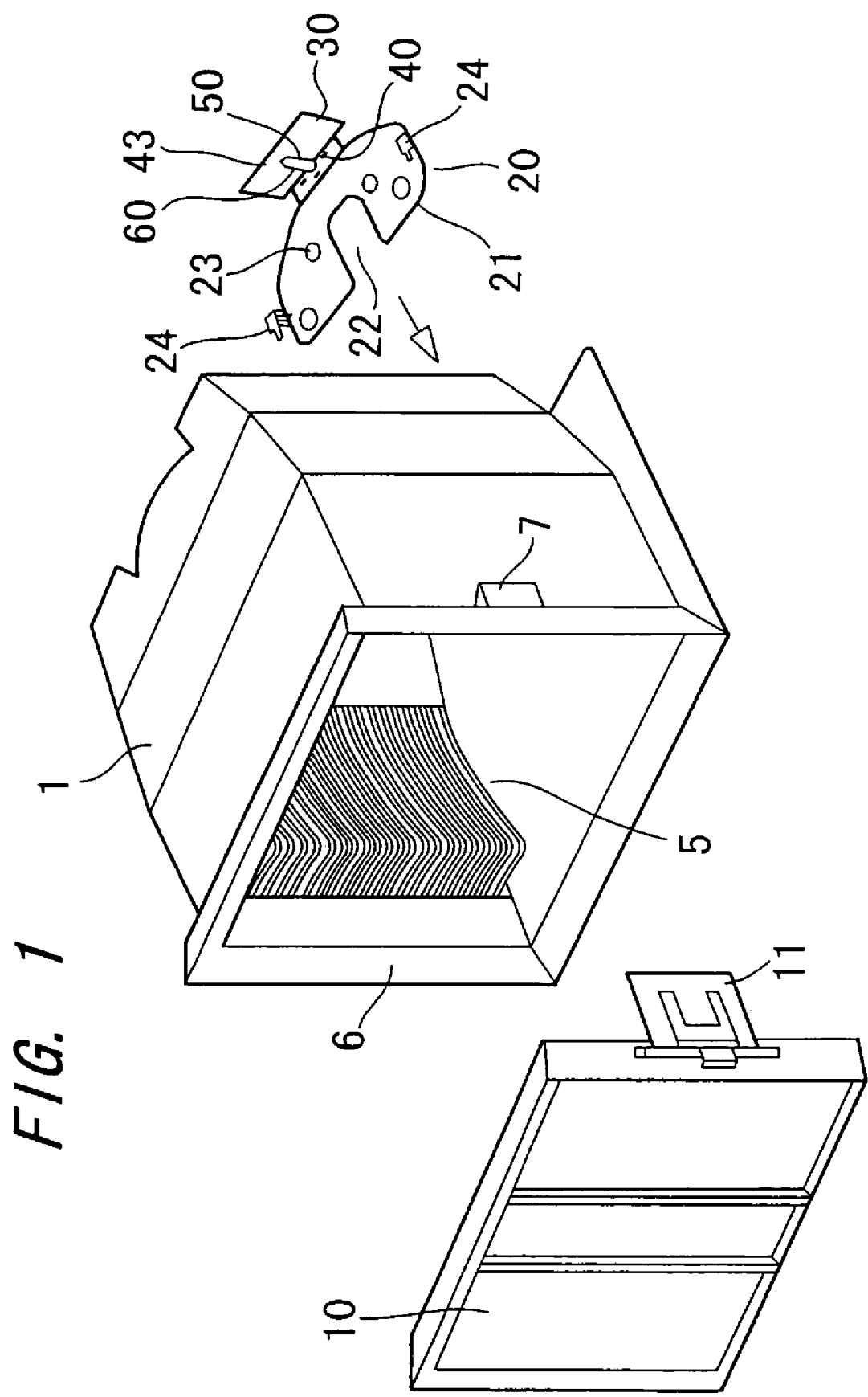
FIG. 1 is an overall exploded perspective view showing the embodiment of a precision substrate storage container according to the present invention.

As shown in FIG. 1, container body 1 is a transparent front-open box type configured with an opening on the front, formed of synthetic resin lightweight and excellent in formability, such as polycarbonate, COP (cyclo-olefin polymer), polyetherimide, polyether sulfone and the like, and maintaining high enough strength, rigidity and dimensional stability, securing normal operation of automatic transport equipment such as AGV and others, and the open front is closed by a removable door component 10. This container body 1 has an unillustrated robotic flange screw fitted at the center on the top thereof, and is conveyed by this robotic flange being gripped by an unillustrated ceiling transporter.

Figure 2:
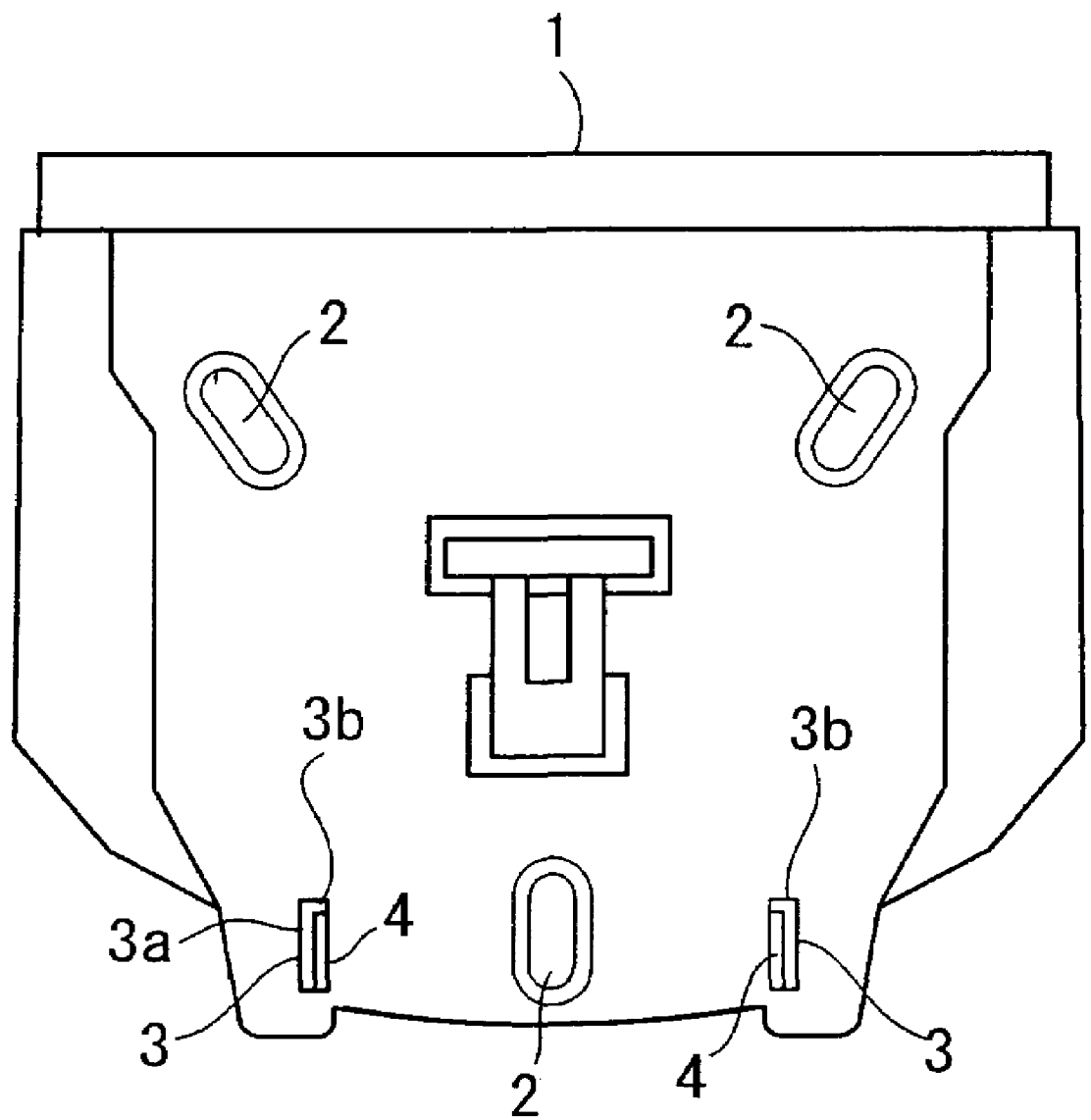
FIG. 2 is a bottom view showing a container body in the embodiment of a precision substrate storage container according to the present invention.
Figure 3:
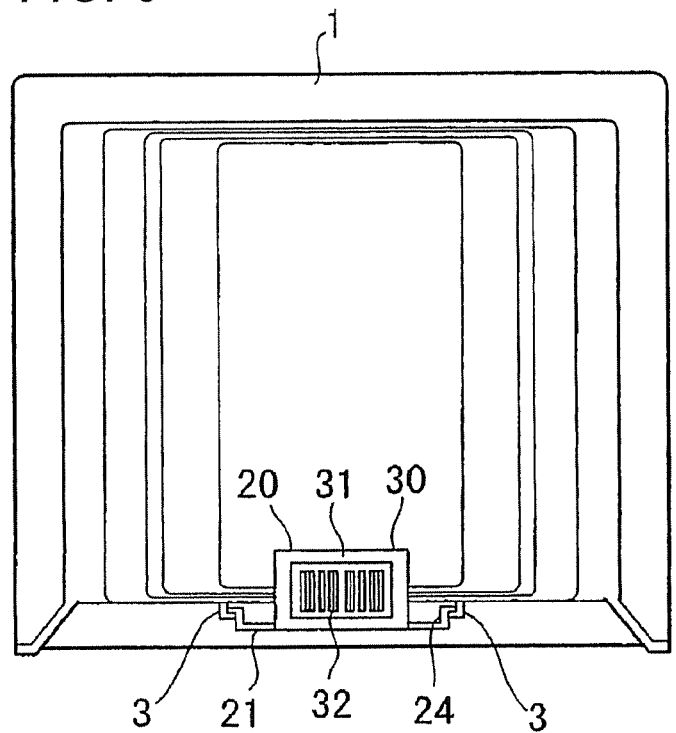
FIG. 3 is a rear view showing the embodiment of a precision substrate storage container according to the present invention.
Figure 4:
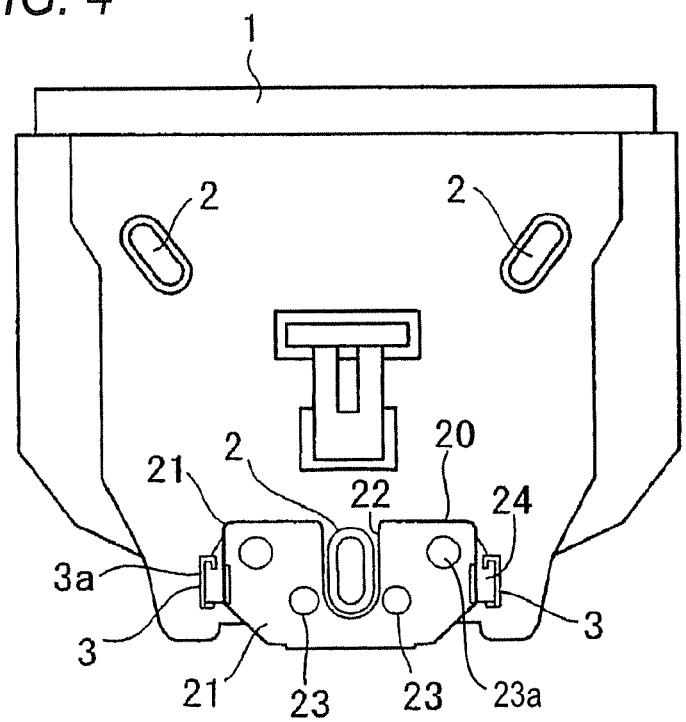
FIG. 4 is a bottom view showing a state where a bottom plate is attached to a container body, in the embodiment of a precision substrate storage container according to the present invention.

As shown in FIGS. 2 and 4, positioning elements 2 having an approximately inverted V-shaped section are separately or integrally formed triangularly viewed from the bottom, at both sides in the front and at the center in the rear on the bottom of container body 1; each positioning element 2 mates an unillustrated positioning pin of unillustrated processing equipment so as to position the precision substrate storage container to the processing equipment. Each positioning element 2 is shaped in an approximately oval form in plan view and formed of a material having an excellent abrasion resistance, such as polypropylene, polycarbonate, polybutyl terephthalate, polyether-etherketone, polyetherimide, etc. As the precision substrate storage container is positioned to processing equipment by means of these positioning elements 2, semiconductor wafers are loaded from the precision substrate storage container to the processing equipment or unloaded vice versa.

The processing equipment herein indicates a device for loading semiconductor wafers from the precision substrate storage container and transferring them into another in-process container, a device for automatically opening and closing door component 10 or for mounting container body 1 with its door open and loading semiconductor wafers and feeding them into another device for implementing various treatments and processes such as oxidation, photoresist application, exposure, etching, cleaning, membrane forming and others.

As shown in FIGS. 2, 4, 9 and 10, at both sides in the rear on the bottom of container body 1 a pair of supporting ribs 3 are arranged on both left and right sides of, and spaced from, the rear positioning element 2, so that bottom plate 20 is removably attached between these paired supporting ribs 3. Each of paired supporting ribs 3 is formed in an approximately L-shape, viewed from the bottom, with a groove 4 on the inner side, so that these grooves 4 oppose each other. In each supporting rib 3 a longitudinal piece 3a providing a guiding function is extended from the front to the rear of container body 1 and short piece 3b is directed inwards with respect to the left-and-right direction.

As shown in FIG. 1, multiple pairs of supporting ribs 5 for supporting semiconductor wafers horizontally are arranged vertically with a predetermined pitch. These multiple pairs of supporting ribs 5 are integrally formed or separately attached on the inner surfaces of left and right side walls of container body 1. Each supporting rib 5 is defined by a top surface that can horizontally support the peripheral side edge of a semiconductor wafer and an undersurface that is inclined so that it tapers at the free end where the intersection between the surfaces form a curved edge. The front side where container body 1 has an opening, is formed with a rim portion 6 that is bent and jutting outwards, and the interior stepped face of rim portion 6 forms a seal surface. A pair of engaging projections 7 for door fixture are projectively formed on the exterior wall surfaces on both sides of container body 1.

As shown in FIG. 1, door component 10 is formed in an approximately rectangular form using a lightweight synthetic resin having excellent formability such as polycarbonate, COP, polyetherimide, etc., and is hermetically fitted into rim portion 6 of container body 1 with an endless sealing element in-between. This door component 10 has a pair of engaging plates 11, which are pivotally hinged on both the left and right sides thereof and each have a U-shaped cutout that fits engaging projection 7 of container body 1. A multiple number of front retainers (not shown) that horizontally support semiconductor wafers at their front edge are arranged vertically on the inner surface of door component 10.

The sealing element interposed between the interior of rim portion 6 of container body 1 and door component 10 is formed in a frame form using a thermoplastic polyolefin or polyester elastomer, fluororubber, silicone rubber or the like, and brought into pressure contact with the interior stepped surface of rim portion 6 when door component 10 is fitted and covered. This sealing element is preferably formed of a forming material which contains little organic components that would contaminate semiconductor wafers and has a hardness of 80 degrees or lower, based on the K6301A measurement defined by JIS.

As shown in FIG. 1, FIGS. 3 to 6, FIGS. 9 and 10, bottom plate 20 is configured of a base plate 21 that closely opposes the rear part of the bottom as an identification area of container body 1 and a wall plate 30 arranged upright at the rear end of the base plate 21 and opposes part (identification area) of the backside of container body 1. Base plate 21 has a first supporting structure 40 for supporting holder 50 with its length directed horizontally while wall plate 30 has a second supporting structure 43 for supporting holder 50 with its length directed vertically. This bottom plate 20 is formed of a synthetic resin such as polypropylene, polycarbonate, polybutylene terephthalate and the like.

Base plate 21 for bottom plate 20 is a polygonal flat plate having an evading slot 22 that is cut in from the center in the front end to the rear, so that this evading slot 22 prevents bottom plate 20 from improperly interfering with the positioning element 2 at the rear of container body 1 as it fits the positioning element 2 from the rear side. This base plate 21 has multiple round cap holes 23 formed at predetermined intervals; these multiple cap holes 23 are selectively fitted in, as required, with caps 23a (also called info-pads) so that processing equipment is able to identify the specifications (the type of the precision substrate storage container, the storage amount of semiconductor wafers and the like) of precision substrates. Arranged on both the left and right sides of base plate 21 are supported elements 24, respectively. The paired supported elements 24 removably engage respective paired supporting ribs 3 of container body 1.

Figure 5:
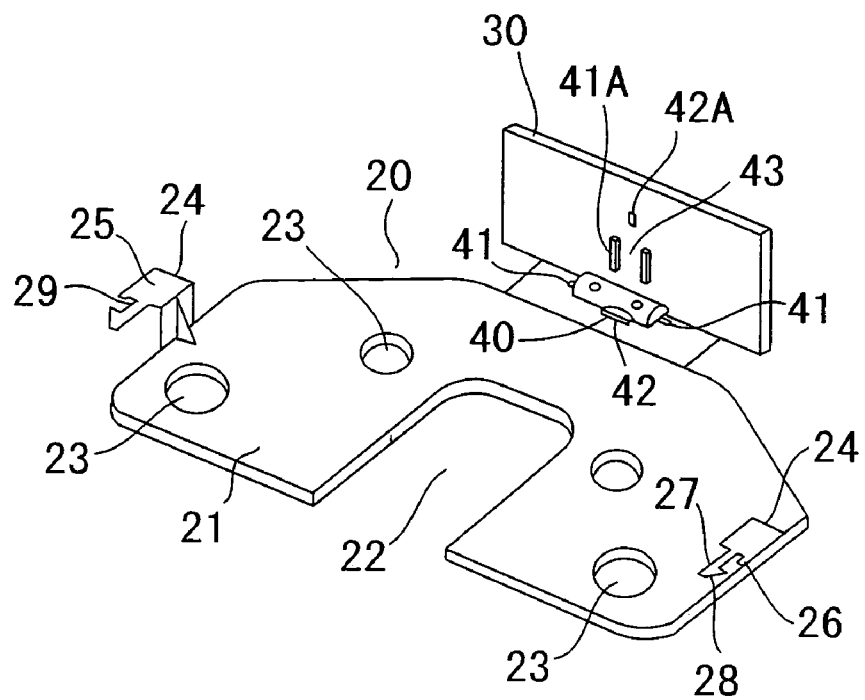
FIG. 5 is a perspective view showing a state where a holder is supported by a first supporting structure of a bottom plate, in the embodiment of a precision substrate storage container according to the present invention.
Figure 6:
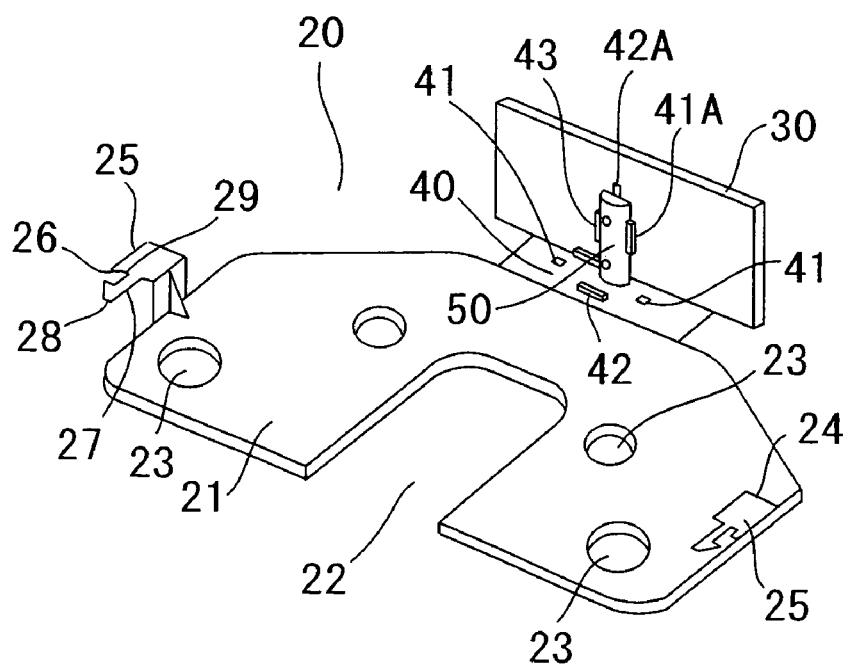
FIG. 6 is a perspective view showing a state where a holder is supported by a second supporting structure of a bottom plate, in the embodiment of a precision substrate storage container according to the present invention.
Figure 10:
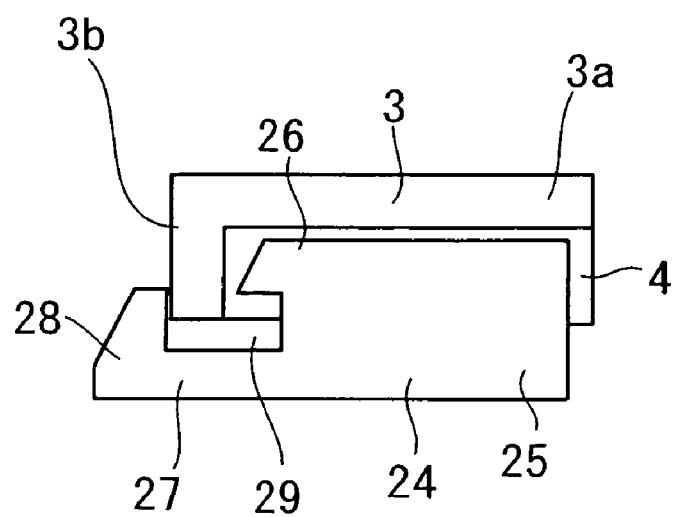
FIG. 10 is an illustrative view showing the relationship between a supporting rib of a container body and a bottom plate attachment in the embodiment of a precision substrate storage container according to the present invention.

Each supported element 24, as shown in FIGS. 5, 6 and 10, is formed of a main part 25 that extends sideward of base plate 21, a stopper projection 26 that extends forward from the outer front of main part 25, a flexible neck piece 27 that is elongated forwards, longer than stopper projection 26 from the inner front of main part 25 and an anti-falling projection 28 formed approximately triangularly sideward at the front of neck piece 27, defining a cutout space 29 between stopper projection 26 and neck piece 27. Stopper projection 26 and anti-falling projection 28 are positioned on the inner side of longitudinal piece 3a of supporting rib 3 to hold short piece 3b. This holding makes bottom plate 20 steadily attach to container body 1 (see FIG. 10).

Wall plate 30 of bottom plate 20, as shown in FIGS. 1, 5 and 6, has a rectangular, landscape shape with a bar code area 31 formed on the backside that does not oppose container body 1. In this bar code area 31 a bar code 32 is directly applied or a bar code 32 is removably inserted into a pocket (see FIG. 3).

Figure 9:
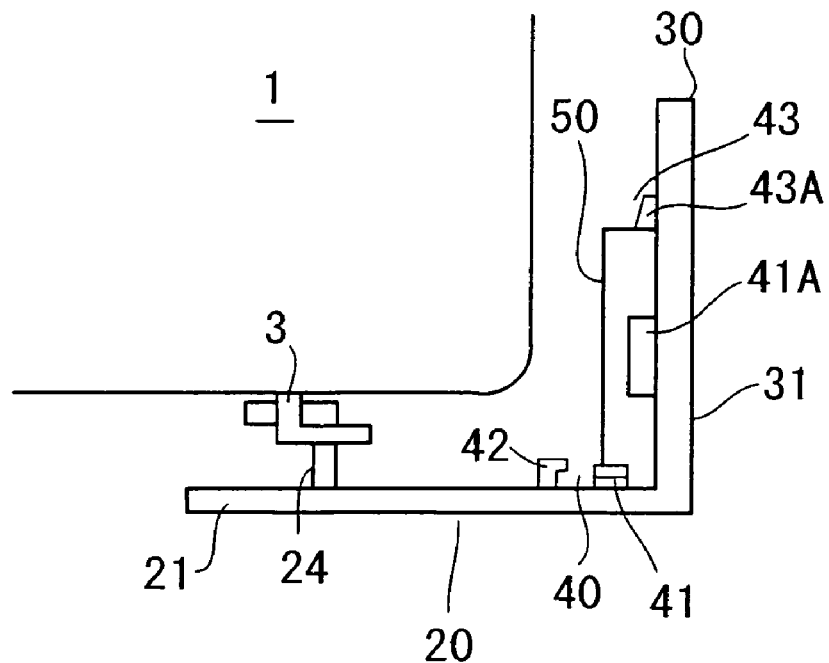
FIG. 9 is an illustrative view showing a state of attachment of a bottom plate to a container body in the embodiment of a precision substrate storage container according to the present invention.

First supporting structure 40, as shown in FIGS. 5 and 9, is composed of a pair of engaging claws 41 arranged left and right apart from each other in the rear part of base plate 21, for engaging holder 50 at its front and rear ends and a groove-formed engaging rib 42 arranged at the rear part of base 21 for engaging one long side of holder 50 and is located adjacent to the bottom of wall plate 30.

Second supporting structure 43, as shown in the same figures, is composed of a groove-formed engaging rib 42A disposed opposing each other, around the center on the front face of wall plate 30 for engaging the upper end of holder 50 and a pair of engaging claws 41A arranged apart from each other and opposing each other, near the center on the front face of wall plate 30, for engaging the left and right sides of holder 50.

Engaging claws 41 and 41A of first and second supporting structures 40 and 43 each have an approximately L-shape having a height ranging ¼ to ½ of the thickness of holder 50 in contact therewith, and the approximately crooked front part is formed with a slant so as to allow easy attachment and removal of holder 50. The reason the heights of engaging claws 41 and 41A are specified within the above range is that a height less than ¼ the thickness produces a fear of holder 50 being disengaged during usage while a height in excess of ½ the thickness makes attachment and disengagement difficult, resulting in poor workability. Also, engaging ribs 42 and 42A of first and second supporting structures 40 and 43 are formed in L-shape.

Figure 7:
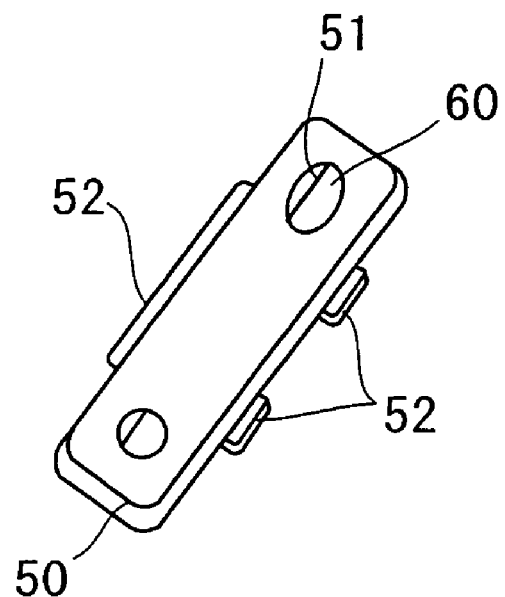
FIG. 7 is a perspective view, viewed from the rear side, showing a holder in the embodiment of a precision substrate storage container according to the present invention.
Figure 8:
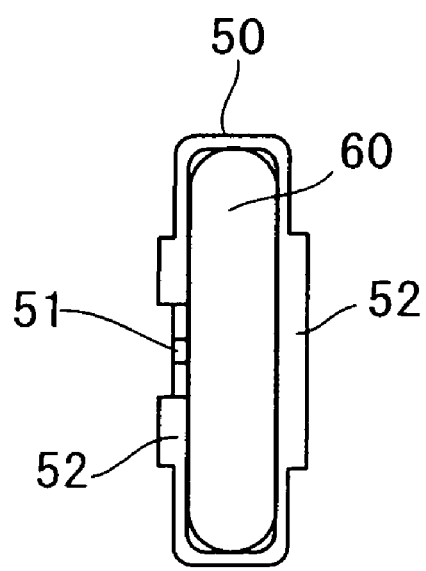
FIG. 8 is a front view showing a holder in the embodiment of a precision substrate storage container according to the present invention.

As shown in FIGS. 7 and 8, holder 50 is formed of a predetermined thermoplastic resin into a hollow, approximately semi-cylindrical configuration or a part having an approximately U-shape in section, and has a multiple number of draining holes 51 formed at predetermined intervals on the backside, side part and the like. These multiple draining holes 51 improve water drainage during cleaning and allow for visual observation of the presence or absence of transponder 60 and the presence or absence of its breakage. An anti-falling claw (not shown) for preventing transponder 60 from falling off is projectively formed inside the holder 50. A single or a multiple number of flanges 52 are projectively formed outward on the left and right sides of the open rim of holder 50, and these flanges 52 will be removably engaged with engaging rib 42 of first supporting structure 40 or engaging claws 41A of second supporting structure 43.

It should be noted that draining holes 51 of holder 50 may be changed in shape, size and number as appropriate so as to meet the direction of arrangement of transponder 60, whereby it is possible to keep stable information exchange performance with processing equipment when the transponder is attached to the precision substrate storage container.

Figure 14:
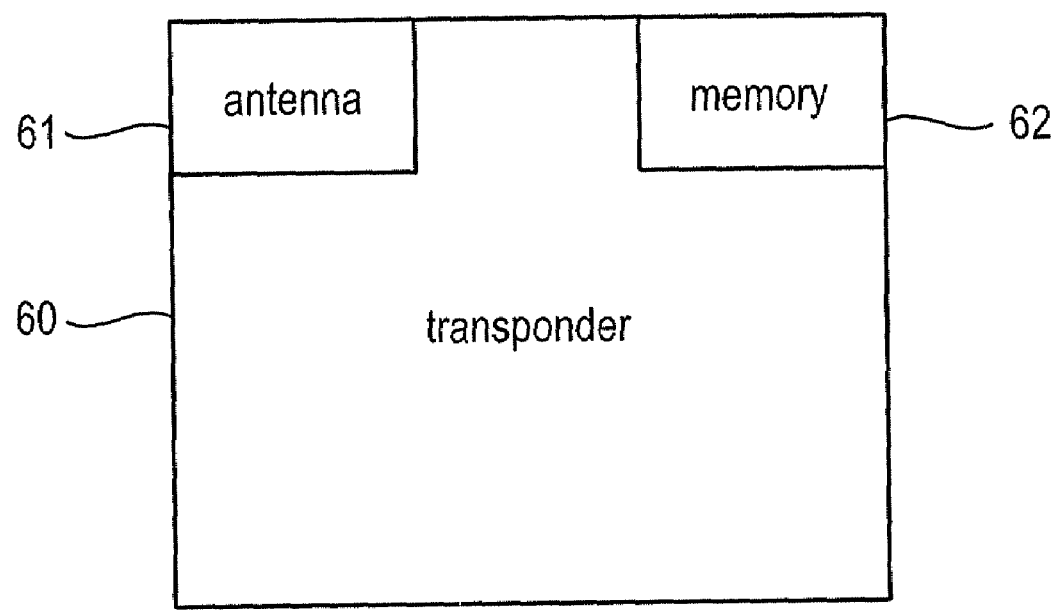
FIG. 14 is a schematic view of a transponder having an antenna and a memory.

Transponder 60 includes an antenna 61, a transmitter/receiver and a memory 62, as schematically illustrated in FIG. 14, and is generally given in a cylindrical form with its surface protectively covered by glass, synthetic resin or the like. The transponder Is fitted In holder 50 and records the semiconductor wafer's lot, fabrication within the processor progress of work.

In the above configuration, when holder 50 holding transponder 60 is laid down and attached to first supporting structure 40 of bottom plate 20, holder 50 can be stably supported by setting the holder 50 transversally between paired engaging claws 41 and engaging rib 42 of first supporting structure 40 so that the opening cannot be seen, and then sliding holder 50 as appropriate in the left and right direction so that flanges 52 of holder 50 fit in and engage the groove of engaging rib 42 while positioning and holding the holder 50 by paired engaging claws 41.

On the other hand, when holder 50 is mounted upright, holder 50 can be stably supported by setting the holder 50 upright between engaging rib 42A and paired engaging claws 41A of second supporting structure 43 so that the opening cannot be seen, and then sliding holder 50 as appropriate so that flanges 52 of holder 50 fit in and engage the groove of engaging rib 42A and positioning and holding the holder 50 by paired engaging claws 41A.

According to the above configuration, since transponder 60 is selectively attached by means of holder 50 to first or second supporting structure 40, 43 of bottom plate 20 so that the direction of transponder 60 is changed as appropriate between two directions, longitudinal and transverse, it is possible to change the orientation of transponder 60 in a simple manner in accordance with the setup specification of the communication area on the equipment side. Specifically, when the interrogator is installed in the direction underneath of container body 1, holder 50 with transponder 60 may and should be supported with first supporting structure 40; when the interrogator is installed in the backside direction of container body 1, holder 50 with transponder 60 may and should be supported with second supporting structure 43. Accordingly, it is possible to markedly effectively solve the problem of communication failure being liable to occur even when the same identical transponder 60 is used.

Further, since the direction of transponder 60 can be changed in accordance with the status, there is no risk of occurrence of communication errors due to its positional relationship relative to the interrogator. Moreover, since it is not necessary to set up a wide reading area, there is no risk of erroneously reading the contents from other nearby transponders 60. Still more, since transponder 60 is accommodated and covered by holder 50 when it is used, in addition to prevention of the transponder against damage, the transponder can be prevented from being set in a wrong direction by a simple configuration. Accordingly, it is possible to markedly and effectively prevent lowering of information transmission function, hence prevent occurrence of variations of information transmission ability during usage even if the same transponder 60 and precision substrate storage container are used.

Furthermore, relatively simple configurations of first and second supporting structures 40 and 43 make it possible to support holder 50 properly and securely.

Figure 11:
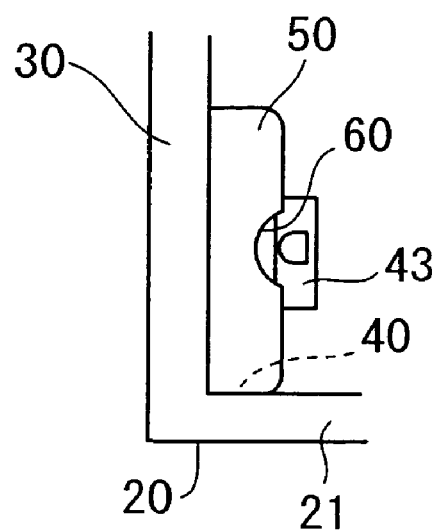
FIG. 11 is an illustrative view showing the second embodiment of a precision substrate storage container according to the present invention.
Figure 12:
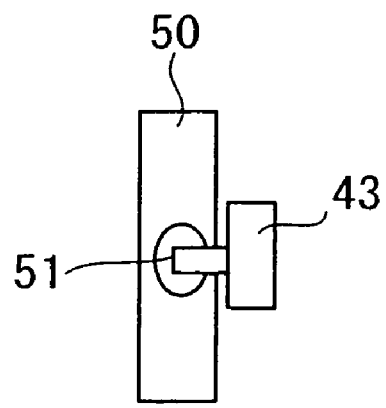
FIG. 12 is an illustrative view showing the second embodiment of a precision substrate storage container according to the present invention.

Next, FIGS. 11 and 12 show the second embodiment of the present invention. In this case, a bottom plate 20 is constituted of a base plate 21 opposing the bottom of container body 1 and a wall plate 30 erected on base plate 21. A first supporting structure 40 for directly or indirectly supporting a transponder 60 which is positioned approximately horizontally is provided on base plate 21 while a second supporting structure 43 for directly or indirectly supporting transponder 60 which is positioned approximately vertically is provided on the inner face of wall of wall plate 30.

First and second supporting structures 40 and 43 may be configured to directly hold transponder 60 or may hold it indirectly by means of a holder 50. Also, engaging claws 41 and 41A or engaging ribs 42 and 42A may be provided so as to hold transponder 60 directly or indirectly. Alternatively, with omission of these, projections or other structures that engage flanges 52 of holder 50 or draining holes 51 of holder 50 may be used for supporting. Other components are the same as the above embodiment, so description is omitted.

Also in this embodiment the same operation and effect as in the above embodiment can be expected and it is obvious that various patterns of attachment of transponder 60 can be developed.

Figure 13:
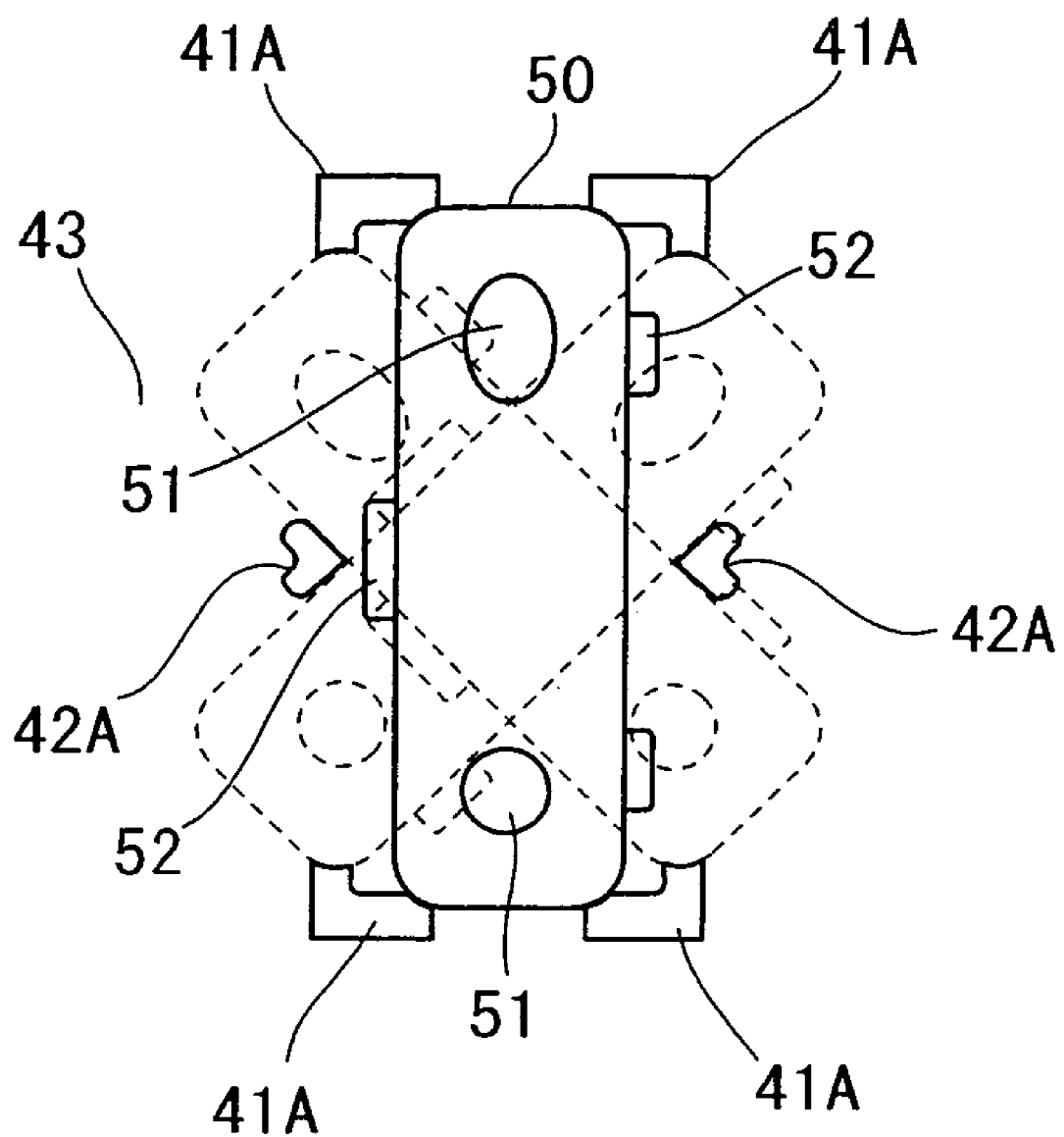
FIG. 13 is an illustrative view showing the third embodiment of a precision substrate storage container according to the present invention.

Next, FIG. 13 shows the third embodiment of the present invention. In this case, at least one of first and second supporting structures 40 and 43 is composed of multiple engaging claws 41A that define a rectangle with its transverse length greater than the width of a holder 50 and a pair of engaging ribs 42A located at the middle points of the long sides of the rectangle defined by these multiple engaging claws 41A, so that the position of holder 50 holding a transponder 60 can be selectively changed so as to take one of three directions.

The present embodiment will be illustrated taking an example of second supporting structure 43. Multiple engaging claws 41A are arranged on the front face of wall plate 30 at the four corners of the rectangle, each engaging claw 41A having a bent form of a transverse-long L-shape, and the engaging claws 41A function to engage the corners of holder 50. Paired engaging ribs 42A are arranged apart from each other on the front face of wall plate 30, each engaging rib 42A having a bent form of an approximately V-shape. When holder 50 is arranged upright, engaging ribs 42A are located opposing each other and spaced from respective sides of holder 50. When holder 50 is slanted 45 degrees to the left or right, holder 50 is engaged at its sides while being held between engaging claws 41A. The thus constructed second supporting structure 43 allows selective change of the position of holder 50 holding transponder 60, taking any one of the upward position, left-slanted position and right slanted position, by means of multiple engaging claws 41A and engaging ribs 42A.

In the case of first supporting structure 40, multiple engaging claws 41A are arranged on base plate 21 at the four corners of the rectangle, each engaging claw 41A having a bent form of an L-shape, and the engaging claws 41A function to engage the corners of holder 50. Paired engaging ribs 42A are arranged apart from each other on base plate 21, each engaging rib 42A having a bent form of an approximately V-shape. Engaging ribs 42A are located opposing each other and spaced from respective sides of holder 50 that is placed horizontally. When holder 50 is arranged obliquely 45 degrees to the left or right, holder 50 is engaged at its sides. Other components are the same as the above embodiment, so description is omitted. This first supporting structure 40 allows selective change of the position of holder 50 holding transponder 60, taking any one of the horizontal position, left-oblique horizontal position, right-oblique horizontal position, by means of multiple engaging claws 41A and engaging ribs 42A.

Also in this embodiment, the same operation and effect as in the above embodiment can be expected and it is obvious that various patterns of attachment of transponder 60 can be developed. The flanges 52 of holder 50 may be formed as shown in FIG. 13, but it is also possible to omit the flanges 52 to make the configuration simple.

In the above embodiment, door component 10 is simply fitted to the open front of container body 1, but the present invention should not be limited to this. For example, it is possible to provide a configuration in which a multiple number of engaging holes are hollowed in the inner periphery of the front of container body 1 while door component 10 incorporates a latch mechanism whereby engaging claws capable of being projected and retracted by external operation fit into the engaging holes. It is also possible to change the number of engaging claws 41 or 41A, engaging ribs 42 or 42A of first and second supporting structures 40 and 43, as appropriate.

It is also possible to support holder 50 by providing recesses in one of either the first or second supporting structure 40, 43 and holder 50 and projections in the respective other for the mating of them. The same arrangement can be used for engagement between container body 1 and bottom plate 20. Further, first and second supporting structures 40 and 43 may be arranged at the bottom, side walls and others of container body 1 so as to support transponder 60 or holder 50.

INDUSTRIAL APPLICABILITY

As described heretofore, according to the present invention, since the position of a non-contact type information medium can be changed so as to take different directions, this configuration is effective in reducing or preventing communication failure and lowering of information transmission ability. Further, if, for example a precision substrate storage container is used at different sites, with different equipment units or others, it is possible to prevent occurrence of variations of information transmission ability.

The invention claimed is:

1. A precision substrate storage container comprising: a container body for accommodating precision substrates; and a non-contact type information medium supported by the container body for identifying the container body and/or precision substrates, characterized in that the position of the non-contact type information medium is changeable so as to allow the medium to orient in at least two different directions of horizontal and vertical;

the container body having a front open box configuration of which a front is opened and closed by a door component, a plate is attached to the container body, and the non-contact type information medium is supported on the plate by a holder;

the plate comprising: a base plate that at least opposes a bottom of the container body; a wall plate erected on the base plate; a first supporting structure provided for the base plate for supporting the holder in an approximately horizontal direction; and a second supporting structure provided for the wall plate for supporting the holder in an approximately vertical direction; and wherein the first supporting structure for supporting the holder in an approximately horizontal direction is composed of multiple engaging claws and an engaging rib, the multiple engaging claws being arranged horizontally apart from and opposing each other in a rear part of the base plate and hooked on two ends of the holder, and the engaging rib being hooked on one long side part of the holder by a flange.

2. The precision substrate storage container according to claim 1, wherein the precision substrates are semiconductor wafers.

3. The precision substrate storage container according to claim 1, wherein the non-contact type information medium is a transponder that responds to an interrogator of a RFID system.

4. The precision substrate storage container according to claim 3, wherein the transponder, at least, includes an antenna, a transmitter/receiver and a memory and is shaped in an approximately cylindrical form.

5. The precision substrate storage container according to claim 4, wherein the holder has an approximately U-shaped section, and a multiple number of flanges are projected outwards from the periphery of an opening of the holder.

6. The precision substrate storage container according to claim 5, wherein the holder is formed with passage holes at least providing a water draining function.

7. A precision substrate storage container comprising: a container body having an opening on one side to which precision substrates are loaded; and a door component for closing the opening of the container body, characterized in that a plate is attached so as to at least oppose one side of the container body and the plate is adapted to support a non-contact type information medium for identifying the container body and/or precision substrates in a changeable manner that allows the medium to orient in at least two different directions of horizontal and vertical;

the plate comprising: a base plate that at least opposes a bottom of the container body; a wall plate erected on the base plate; a first supporting structure provided for the base plate for supporting the non-contact type information medium in an approximately horizontal direction; and a second supporting structure provided for the wall plate for supporting the non-contact type information medium in an approximately vertical direction; and wherein the first supporting structure for supporting the non-contact type information medium in an approximately horizontal direction is composed of multiple engaging claws and an engaging rib, the multiple engaging claws being arranged horizontally apart from and opposing each other in a rear part of the base plate and hooked on two ends of a holder supporting the non-contact type information medium, and the engaging rib being hooked on one long side part of the holder supporting the non-contact type information medium by a flange.

8. The precision substrate storage container according to claim 7, wherein the non-contact type information medium is a transponder that responds to an interrogator of a RFID system.

9. The precision substrate storage container according to claim 8, wherein the transponder, at least, includes an antenna, a transmitter/receiver and a memory and is shaped in an approximately cylindrical form.

10. The precision substrate storage container according to claim 1, wherein a pair of supporting ribs are provided on a rear bottom of the container body, and supported elements that are to be removably attached to the supporting ribs are provided at both sides of the base plate.

11. The precision substrate storage container according to claim 1, wherein a multiple number of cap holes are formed in the base plate, and the multiple cap holes are selectively fitted with caps so as to allow for identification of the specifications of the precision substrates.

12. The precision substrate storage container according to claim 1, wherein the wall plate is arranged so that the inner surface thereof opposes the backside of the container body and a bar code is attached to the outer surface of the wall plate.

13. The precision substrate storage container according to claim 1, wherein the second supporting structure for supporting the holder in an approximately vertical direction is composed of a groove-formed engaging rib disposed on the wall plate and hooked on a top end of the holder and multiple engaging claws that are hooked on two sides of the holder arranged apart from and opposing each other by flanges.

* * * * *